(12) United States Patent
Bierl

(10) Patent No.: US 7,212,931 B2
(45) Date of Patent: May 1, 2007

(54) ELECTRIC ENERGY METER FOR AN AC MAINS SUPPLY

(75) Inventor: Lutz Bierl, Erding (DE)

(73) Assignee: Texas Instruments Deutschland GmbH, Haggertystrasse 1 Freising (DE)

( * ) Notice: Subject to any disclaimer, the term of this patent is extended or adjusted under 35 U.S.C. 154(b) by 56 days.

(21) Appl. No.: 10/901,709

(22) Filed: Jul. 27, 2004

(65) Prior Publication Data

US 2005/0071096 A1 Mar. 31, 2005

(30) Foreign Application Priority Data

Jul. 29, 2003 (DE) ................. 103 34 517

(51) Int. Cl.
*G01R 21/00* (2006.01)

(52) U.S. Cl. ........................................... 702/61
(58) Field of Classification Search ............ 702/61
See application file for complete search history.

(56) References Cited

U.S. PATENT DOCUMENTS 4,998,061 A * 3/1991 Voisine et al. ............ 324/142

| 6,239,589 | B1 | 5/2001 | Windsheimer |
| 6,377,037 | B1 | 4/2002 | Burns et al. |
| 6,417,792 | B1 | 7/2002 | King et al. |
| 2006/0129339 | A1* | 6/2006 | Bruno .................. 702/60 |

FOREIGN PATENT DOCUMENTS

EP 0634662 A1 1/1995

* cited by examiner

*Primary Examiner*—John Barlow
*Assistant Examiner*—Cindy D. Khuu
(74) *Attorney, Agent, or Firm*—W. James Brady, III; Frederick J. Telecky, Jr.

(57) ABSTRACT

An energy consumption meter having a variable phase error compensator. While the variable phase error compensator may provide fixed phase error compensation for fixed phase error(s), it may also provide variable compensation for varying phase error(s) introduced by one or more parameters. Varying phase error(s) may be introduced, for example, by fluctuations in the frequency of an alternating current supply. Such varying phase errors may be corrected by monitoring one or more sources of varying phase error(s), calculating one or more appropriate corrections, and correcting one or more sampled parameters involved in determining energy consumption. This avoids erroneous energy consumption metering due to varying phase errors.

5 Claims, 1 Drawing Sheet

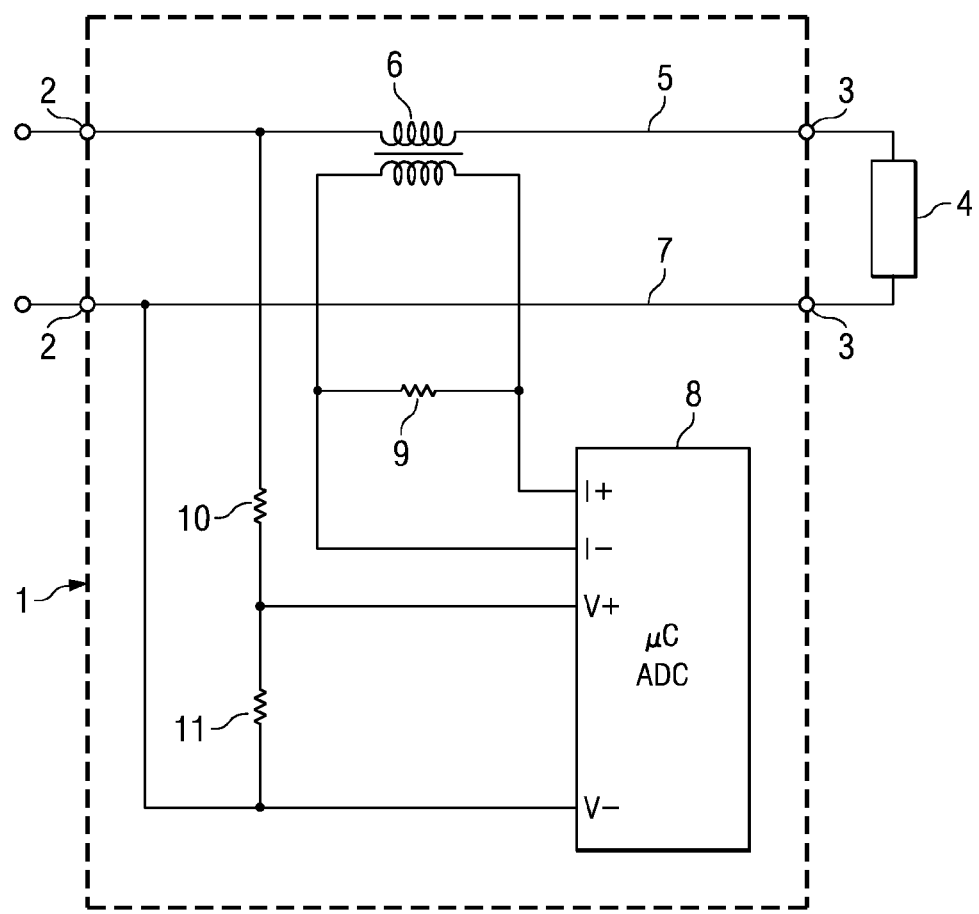

ELECTRIC ENERGY METER FOR AN AC MAINS SUPPLY

CROSS REFERENCE TO RELATED APPLICATIONS

This application claims priority under 35 USC § 119 of German Application Serial No. 10334517.5, filed Jul. 29, 2003.

FIELD OF THE INVENTION

The present invention relates to an electric energy meter for an AC mains supply, also called electricity meter.

BACKGROUND OF THE INVENTION

A key component of an electronic electricity meter is a current transformer that is used as a current sensor. Typical current transformers for this purpose have a core of a magnetic material, a primary conductor axially led through a central hole of the core and constituting a current loop, and a secondary winding galvanically insulated from the primary conductor, the ratio between the primary and secondary being on the order of several thousands. The secondary voltage developed at the terminals of the secondary windings is representative of the primary current, and thus of the electric power consumed. A measurement of an electric energy consumption is obtained by repeatedly sampling this voltage and the mains voltage, multiplying the voltage pairs with each other and with the sampling period and accumulating the multiplication products.

Due to magnetic saturation effects of conventional core materials, current transformers exhibit significant amplitude errors when the current through the primary conductor has a DC component Recently, current transformers have been proposed that tolerate a DC component in the primary current by not producing significant amplitude errors. These current transformers are referred to as DC tolerant current transformers.

DC tolerant current transformers, however, suffer from the problem that they have an inherent phase angle error. This phase angle error causes large measurement errors for phase angles of the load different from zero. For example, when the phase angle error at the nominal mains frequency of 50 Hz is +4.0° and the phase angle of the load is 60.0°, the measurement error amounts to +11.8%. A measurement error of this magnitude is not acceptable. It has been proposed to correct the measurement error with a simple RC combination in the path of the analog voltage signal upstream from the A/D converter. This approach is successful for a constant mains frequency, but ignores the fact that the actual mains frequency may well deviate from the nominal mains frequency.

SUMMARY OF THE INVENTION

In fact, both the phase angle error of the DC tolerant current transformer and the compensating phase shift of a given RC combination are dependent on the mains frequency. However, the dependency is not the same for both. As the present inventors have found, they are in fact opposite to each other. i.e. while the phase shift caused by the RC combination increases with increasing frequency, the phase shift caused by the DC tolerant current transformer decreases. In consequence, when the momentary mains frequency deviates from the nominal frequency, the measurement error obtained with an RC-compensated transformer is even greater than with an uncompensated one.

The present invention provides a solution to this problem. Specifically, the present invention provides an electric energy meter for an AC mains supply that comprises a current transformer with a primary conductor and a secondary winding in which a phase shift, referred to in the following as a transformer phase shift, exists between the current in the primary conductor and the secondary voltage, such as occurs in a DC tolerant current transformer. The meter has first sampling means connected to the primary conductor for obtaining a first series of samples representative of the voltage of the AC mains, second sampling means connected to the secondary winding for obtaining a second series of samples representative of the secondary voltage, and integrating means for integrating energy samples obtained from the first and second series of samples. Instead of effecting a phase shift by analog means on the secondary voltage of the transformer, the present invention uses calculating means for obtaining a phase compensated series of samples by applying a phase shift correction that compensates the transformer phase shift to each sample from the second series of samples, the thus compensated series being input into the integrating means. In this case, the correction is applied to the samples of the secondary voltage. In an alternative embodiment of the invention, a similar correction is applied to the samples of the AC mains voltage.

Using such calculating means, a very precise compensation is obtained if the phase shift to be applied to the second series of samples (or to the first series of samples in the alternative embodiment) is set proportional to the momentary mains period.

For obtaining this momentary mains period, it is preferred to measure a time between two zero crossings of the main voltage.

In a practical embodiment, the phase shift correction is applied by obtaining the difference between two successive samples from the first or second series and by subtracting from each said sample a term proportional to such difference, the square of the measured mains period and a constant. The constant may be a product of a nominal mains frequency, the sampling rate and the nominal transformer phase shift at the nominal mains frequency divided by 360.

Further advantages and features of the invention will appear from the following detailed description of preferred embodiments with reference to the appending drawing.

BRIEF DESCRIPTION OF THE DRAWINGS

FIG. 1 illustrates a block diagram of an electric energy meter of the present invention.

DETAILED DESCRIPTION OF THE DRAWINGS

The FIGURE illustrates an electric energy meter 1 according to the invention. The energy meter has two input terminals 2 for connecting to an AC mains having a frequency $f_{mains}$ that may deviate momentarily from a nominal frequency $f_{mains,nom}$ and two output terminals 3 to which a load 4 may be connected. In a live line 5 connecting one of the input terminals 2 to one of the output terminals 3, a primary conductor of a DC tolerant current transformer 6 is installed. A neutral line 7 directly connects the other ones of the input and output terminals 2, 3. Terminals of a secondary winding of the current transformer 6 are connected to each other via a resistor 9 and to current detection ports I+, I− of an integrated circuit 8. A secondary voltage induced in the secondary winding by a current flowing through the load 4 is also present at the current detection ports I+, I− of the integrated circuit 8. The name "current detection ports" is not to imply that the quantity detected at these ports is a current flowing through them but that the detected quantity is directly proportional to the current through load 4.

Resistors 10, 11 are mounted in series so as to form a voltage divider between the live and neutral lines 5, 7. The integrated circuit 8 has voltage-measuring ports V+, V−, one of which is connected to an intermediate point between resistors 10, 11 of the voltage divider and the other is connected to the neutral line 7.

The voltage between voltage measuring ports V+, V− of the integrated circuit is thus directly proportional to the mains voltage between live and neutral lines 5, 7, whereas the voltage between current measuring ports I+, I− of the integrated circuit is proportional to a secondary voltage induced in the secondary winding of current transformer 6. This secondary voltage has a phase shift $Æ_{CT}$ with respect to the current in the primary conductor of the transformer 6 which is dependent on the mains frequency $f_{mains}$. In order to obtain a correct measurement of the energy consumption of load 4, this phase shift $Æ_{CT}$ must be taken account of in the integrated circuit 8.

The integrated circuit 8 includes an analog-digital-converter and a microcomputer. The analog-digital converter operates at a frequency $f_{ADC}$ far in excess of the nominal mains frequency so as to obtain a first series of samples representative of the secondary voltage of transformer 6 and a second series of samples representative of momentary values of the mains voltage. The samples of the first series are also used to determine the momentary period $t_{mains}=1/f_{mains}$ of the mains voltage by measuring the time between successive zero crossings.

Prior to multiplying corresponding samples of the first and second series, and accumulating the products to obtain the amount of electric power consumed in load 4, the samples of the second series are corrected for the inherent phase error of the DC tolerant transformer 6.

Specifically, to compensate the inherent phase error caused by the transformer 6 in its secondary voltage phase compensated current samples $I_{n,corr}$ are obtained by application of a formula $$I_{n,corr} = I_n - (I_n - I_{n-1})t_{mains}^2 * f_{mains,nom} * f_{CLK} * \frac{\varphi_{CTnom}}{360°},$$

wherein $(I_n-I_{n-1})$ is the difference of two succeeding samples, $t_{mains}$ is the measured momentary mains period in seconds, $f_{mains,nom}$ is the nominal mains frequency in Hz, $f_{CLK}$ is the sampling frequency in Hz and $\phi_{CTnom}$ is the known transformer phase shift, or error, of transformer 6 at the nominal mains frequency $f_{mains,nom}$ in °. Note that $(I_n-I_{n-1})*f_{CLK}$ is equivalent to a numerical time derivative of the secondary current, and $t_{mains} f_{mains,nom} \phi_{Cnom}$, is equivalent to the transformer phase shift at the momentary mains period. A convenient representation of the above formula is obtained by combining the constant parameters into a single constant k, as follows:

$$I_{n,corr}=I_n-\Delta I_n * t_{mains}^2 * k$$

Where:
$I_{n,corr}$ Corrected current sample [A]
$I_n$ Last current sample [A]
$I_{n-1}$ Last but one current sample [A]
$\Delta I_n$ Difference of last two current samples $(I_n-I_{n-1})$ [A]
$f_{ADC}$ Measurement repetition rate of the ADC [Hz]
$t_{mains}$ Current mains period $(1/f_{mains})$ [s]
k Constant factor $(f_{mains, nom}*f_{ADC}*\phi_{CTnom}/360)$ [Hz²]

In the above embodiment of the invention, the correction is applied to the samples of the secondary voltage which are representative of the primary current. In an alternative embodiment, the correction is applied to the samples of the AC mains voltage, using the same approach. Accordingly, in the above expressions, "I" should be replaced with "U" to designate a voltage sample instead of a current sample.

The invention claimed is:

1. An electric energy meter for an AC mains supply providing an AC mains voltage, the electric energy meter comprising:
   (a) a current transformer with a primary conductor connected to the AC mains supply and to a load, and a secondary winding inductively producing a secondary voltage, in which a transformer phase shift exists between the current in the primary conductor and the secondary voltage;
   (b) an AC mains voltage sampler connected to the primary conductor;
   (c) a current sampler connected to the secondary winding; and
   (d) a microcomputer coupled to the AC mains voltage sampler and to the current sampler, the microcomputer operable to compute a frequency for the AC mains voltage, a correction for the transformer phase shift dependent upon the AC mains voltage frequency, and an integration of the products of samples of the AC mains voltage multiplied by the samples of the current and corrected for the frequency-dependent transformer phase shift;
   (e) whereby the integration provides a measure of electric energy provided to the load.

2. The electric energy meter of claim 1, wherein the mains voltage sampler includes a voltage divider coupled to an analog-to-digital converter.

3. The electric energy meter of claim 1, wherein the secondary voltage sampler includes a resistor coupled to an analog-to-digital converter.

4. The electric energy meter of claim 1, wherein the correction for the transformer phase shift dependent upon the AC mains voltage frequency $$t_{mains} f_{mains-nom}\phi_{CTnom}$$

where $t_{mains}$ is a measured AC mains voltage period, $f_{mains-nom}$ is a nominal AC mains voltage frequency, and $\phi_{CTnom}$ is the transformer phase shift at the nominal AC mains voltage frequency.

5. The electric energy meter of claim 1, wherein the products of samples of the AC mains voltage multiplied by the samples of the current and corrected for the frequency-dependent transformer phase shift are the products $U_n I_{n,corr}$ where $U_n$ is a sample of the AC mains voltage and $I_{n,corr}$ is a corrected current sample with $$I_{n,corr}=I_n-(I_n-I_{n-1})\, t_{mains}^2 f_{mains-nom} f_{CLK}\phi_{CTnom}/\, 360°$$

where $I_n$ and $I_{n-1}$ are successive current samples, $f_{CLK}$ is a sampling frequency, $t_{mains}$ is a measured AC mains voltage period, $f_{mains-nom}$ is a nominal AC mains voltage frequency, and $\phi_{CTnom}$ is the transformer phase shift at the nominal AC mains voltage frequency expressed in degrees.

* * * * *